(12) United States Patent
Zakharchenko et al.

(10) Patent No.: US 7,631,248 B2
(45) Date of Patent: Dec. 8, 2009

(54) CYCLE-STEALING DECODING APPARATUS, SYSTEMS, AND METHODS

(75) Inventors: Konstantin Vladimirovich Zakharchenko, Joltie Vody (UA); Mikhail Yurievich Lyakh, Nizhny Novgorod (RU); Oleg Borisovich Semenov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 453 days.

(21) Appl. No.: 11/346,883

(22) Filed: Feb. 3, 2006

(65) Prior Publication Data

US 2006/0193404 A1 Aug. 31, 2006

Related U.S. Application Data

(63) Continuation of application No. PCT/RU2004/000380, filed on Sep. 29, 2004.

(51) Int. Cl.
H03M 13/00 (2006.01)
(52) U.S. Cl. ............ 714/780; 375/341; 714/755; 714/786
(58) Field of Classification Search ............ 714/780, 714/795, 755, 786; 375/341
See application file for complete search history.

(56) References Cited

U.S. PATENT DOCUMENTS

2003/0147479 A1* 8/2003 Shah et al. ............ 375/341

FOREIGN PATENT DOCUMENTS

EP 1156588 A1 11/2001
WO WO-2006/038829 A1 4/2006

OTHER PUBLICATIONS

Chunlong, B., et al., "Hardware Implementation of Log-Map Turbo Decoder for W-CDMA Node B with CRC-Aided Early Stopping", *Proc. of IEEE VTC Spring 2002, 2 of 4 Conf. 55*, (May 6, 2002),1016-1019.
Dielissen, J., et al., "State Vector Initialization of sliding Window MAP", *Proc. International Symposium on Turbo codes and Related Topics*, Topics, France,(Sep. 4, 2000),387-390.
Shao, R. Y., et al., "Two Simple Stopping Criteria for Turbo Decoding", *IEEE Transactions on Communications, IEEE Inc.*, 47 (8), (Aug. 1999),1117-1120.
Uhlemann, E., et al., "Packet Combining and Doping in Concatenated Hybrid ARQ Schemes Using Iterative Decoding", *Proc. of Wireless communications and Networking 2003 (WCNC 2003)*, 2, Piscataway, USA,(Mar. 16, 2003),849-854.
"PCT Application No. PCT/RU2004/000380, International Search Report mailed Jul. 29, 2005", 5 pgs.
"PCT Application No. PCT/RU2004/000380, Preliminary Report on Patentability mailed Apr. 12, 2007", 21 pgs.
"PCT Application No. PCT/RU2004/000380, Written Opinion mailed Jul. 29, 2005", 19 pgs.

* cited by examiner

*Primary Examiner*—Guy J Lamarre
*Assistant Examiner*—Sam Rizk
(74) *Attorney, Agent, or Firm*—Schwegman, Lundberg & Woessner, P.A.; Gregory J. Gorrie

(57) ABSTRACT

Apparatus and systems, as well as methods and articles, may operate to buffer a state of an iterative decoder operating on a codeword associated with a partially decoded forward error correction-encoded data block, and to restore the state to perform additional decoding iterations on the block during a period when the decoder is idle.

14 Claims, 3 Drawing Sheets

CYCLE-STEALING DECODING APPARATUS, SYSTEMS, AND METHODS

This application is a continuation under 35 U.S.C. 111(a) of International Application No. PCT/RU2004/000380, filed on 29 Sep. 2004, which is incorporated herein by reference.

TECHNICAL FIELD

Various embodiments described herein relate to communications generally, including apparatus, systems, and methods used to transmit and receive information via wireless networks and other communication channels.

BACKGROUND INFORMATION

High-speed digital communications may benefit from forward error correction techniques, wherein data blocks to be transmitted may be redundantly encoded. On the receiving end, iterative and/or soft decoding techniques may be used to extract received data blocks from the received signal-plus-noise, thereby decreasing the probability of error in the received blocks. Although these techniques may result in a satisfactory percentage of recovered data blocks, the amount of time required to iteratively converge to correctly decoding some blocks may exceed the available inter-block time window. Using processing resources sufficient to assure decoder convergence to acceptable bit error rates may be uneconomical, especially at high block throughput rates.

DETAILED DESCRIPTION

Various embodiments disclosed herein may be used to address the challenge of decreasing circuit complexity and/or processing resource cost when iteratively decoding a forward error correction-encoded data stream, including (optionally) a soft-coded data stream. A soft codeword may include a forward error-encoded data block with a reliability factor associated with one or more bits to form "soft bits." Thus, a soft bit may comprise a real value and/or integer value, possibly derived from a modem and/or radio frequency demodulator, to indicate a probability that the associated bit is of a state represented, rather than the opposite state. For example, a bit included in a block received with a higher SNR than that of a second block may be assigned a reliability of greater magnitude than that of a bit associated with the second block. A hard codeword, on the other hand, may contain data and parity bits without a reliability association.

An iterative decoder may process a received data block by performing a set of operations on the block. The resultant of the set of operations may comprise an intermediate codeword, perhaps a soft codeword (e.g., in the case of a soft decoder). The resultant may be fed back to the decoder input for further processing. Additional cycles of decoding, each acting upon an intermediate codeword comprising the resultant of a previous cycle, may continue until the earlier of a convergence of the resultant and/or receipt of the next data block.

Retransmission may be requested for a block that remains incompletely decoded at the time the next block is received for decoding. Such retransmission may decrease the effective throughput of a communications system. A decoder fast enough to perform real-time decoding at a high throughput rate, so as to avoid retransmissions, may be uneconomical.

Some embodiments disclosed herein may buffer a decoder state associated with an incompletely decoded data block upon expiration of a period (e.g., a "block decode period") corresponding to the block transmission rate. The buffered decoder state may comprise an intermediate hard and/or soft codeword. During a future block decode period, decoding a received data block may converge to completion in less time than the entire block decode period. In that case, a previously-buffered decoder state associated with an incompletely-decoded data block may be restored for further decoding during the remainder of the decode period. For example, some embodiments may employ intelligent buffering techniques to complete decoding of incompletely-decoded data blocks by utilizing otherwise-wasted decoder cycles associated with blocks that decode to completion in less than the allocated amount of time. This process may be termed "cycle stealing."

Figure 1:
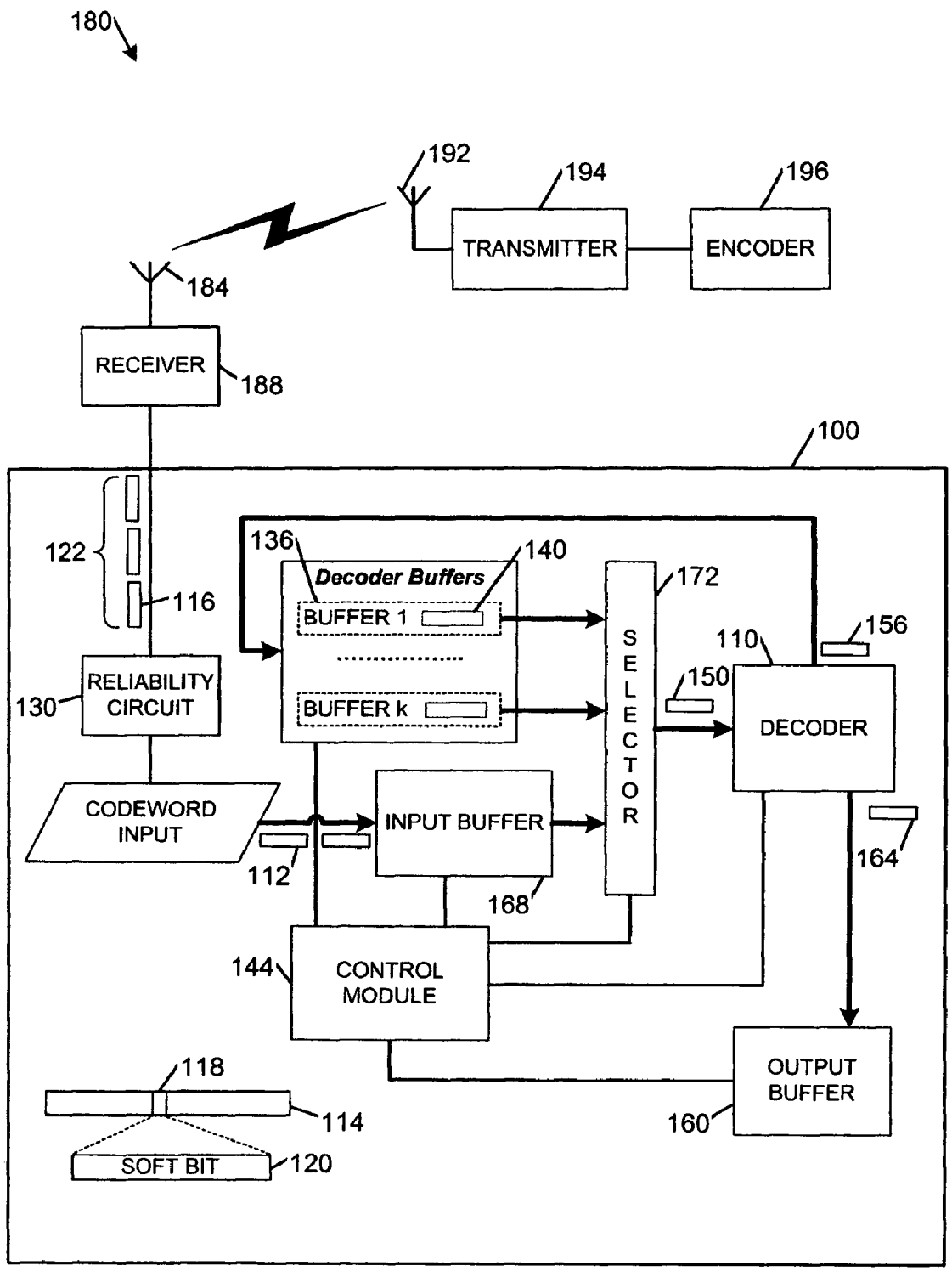
FIG. 1 is a block diagram of an apparatus and a system according to various embodiments of the invention.

FIG. 1 comprises a block diagram of an apparatus 100 and a system 180 according to various embodiments of the invention. The apparatus 100 may include a decoder 110 to perform a variable number of iterative decoding operations on a codeword 112 associated with a data block 116 selected from a plurality of data blocks 122. In some embodiments of the apparatus 100, the variable number of iterative decoding operations may comprise a number of operations required to satisfy a criterion. The criterion may include reaching a state of substantial equivalency of an actual parity value and a calculated parity value, among others.

In some embodiments of the apparatus 100, the decoder 110 may comprise a low-density parity check (LDPC) decoder, a turbo code decoder, and/or some other type of iterative decoder. The codeword 112 may comprise a soft codeword 114. A bit 118 of the soft codeword 114 may comprise a soft bit 120 associated with the soft codeword 114, including a real value and/or an integer value to indicate a probability that a state of a bit associated with the data block 116 is as represented. Some embodiments of the apparatus 100 may include a circuit 130 to generate the soft bit 120.

In some embodiments of the apparatus 100, one or more decoder buffers 136 may be coupled to the decoder 110 to store an intermediate decoder state 140 corresponding to an incompletely decoded data block selected from the plurality of data blocks 122. Some embodiments may include a control module 144 coupled to the decoder 110 to specify for decoding a next codeword 150 associated with an undecoded data block selected from the plurality of data blocks 122 and/or from the intermediate decoder state 140. It should be noted that in some embodiments of the apparatus 100, the intermediate decoder state 140 may comprise an intermediate codeword 156 and/or a resultant of a number of iterations performed on the intermediate codeword 156.

In some embodiments of the apparatus 100, the control module 144 may store a number of iterations executed by the decoder 110 on the intermediate codeword 156, and/or determine a number of additional iterations to be performed on the intermediate codeword 156. The control module 144 may also store an address associated with the one or more decoder buffers 136, and/or an address associated with an output buffer 160.

In some embodiments, the output buffer 160 may be coupled to the decoder 110 to store an output 164 of the decoder 110, and/or an input buffer 168 coupled to the decoder 110 to store a data block 116 included in the plurality of data blocks 122. In some embodiments of the apparatus 100, a selector 172 may be coupled to the decoder buffer 136 and/or to the input buffer 168 to route the next codeword 150 to the decoder 110. In some embodiments, the selector 172 may be controlled by the control module 144. Other embodiments may be realized.

For example, a system 180 may include an apparatus 100 as well as a first antenna 184. The first antenna 184 may comprise an omnidirectional antenna, a patch antenna, a dipole antenna, and/or a unidirectional antenna, among others. Some embodiments of the system 180 may include a receiver 188 coupled to the first antenna 184 to receive an error-correctable bit pattern.

Some embodiments of the system 180 may include a second antenna 192 coupled to a transmitter 194 to transmit an error-correctable bit pattern, and/or an encoder 196 to encode the error-correctable bit pattern.

The apparatus 100; decoder 110; codewords 112, 114, 150, 156; data blocks 116, 122; bits 118, 120; circuit 130; buffers 136, 160, 168; decoder state 140; control module 144; output 164; selector 172; system 180; antennas 184, 192; receiver 188; transmitter 194; and encoder 196 may all be characterized as "modules" herein.

Such modules may include hardware circuitry, and/or a processor and/or memory circuits, software program modules and objects, and/or firmware, and combinations thereof, as desired by the architect of the apparatus 100 and system 180, and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to simulate the operation of various potential embodiments.

It should also be understood that the apparatus and systems of various embodiments can be used in applications other than decoding, and thus, various embodiments are not to be so limited. The illustrations of apparatus 100 and system 180 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, and others. Some embodiments may include a number of methods.

Figure 2:
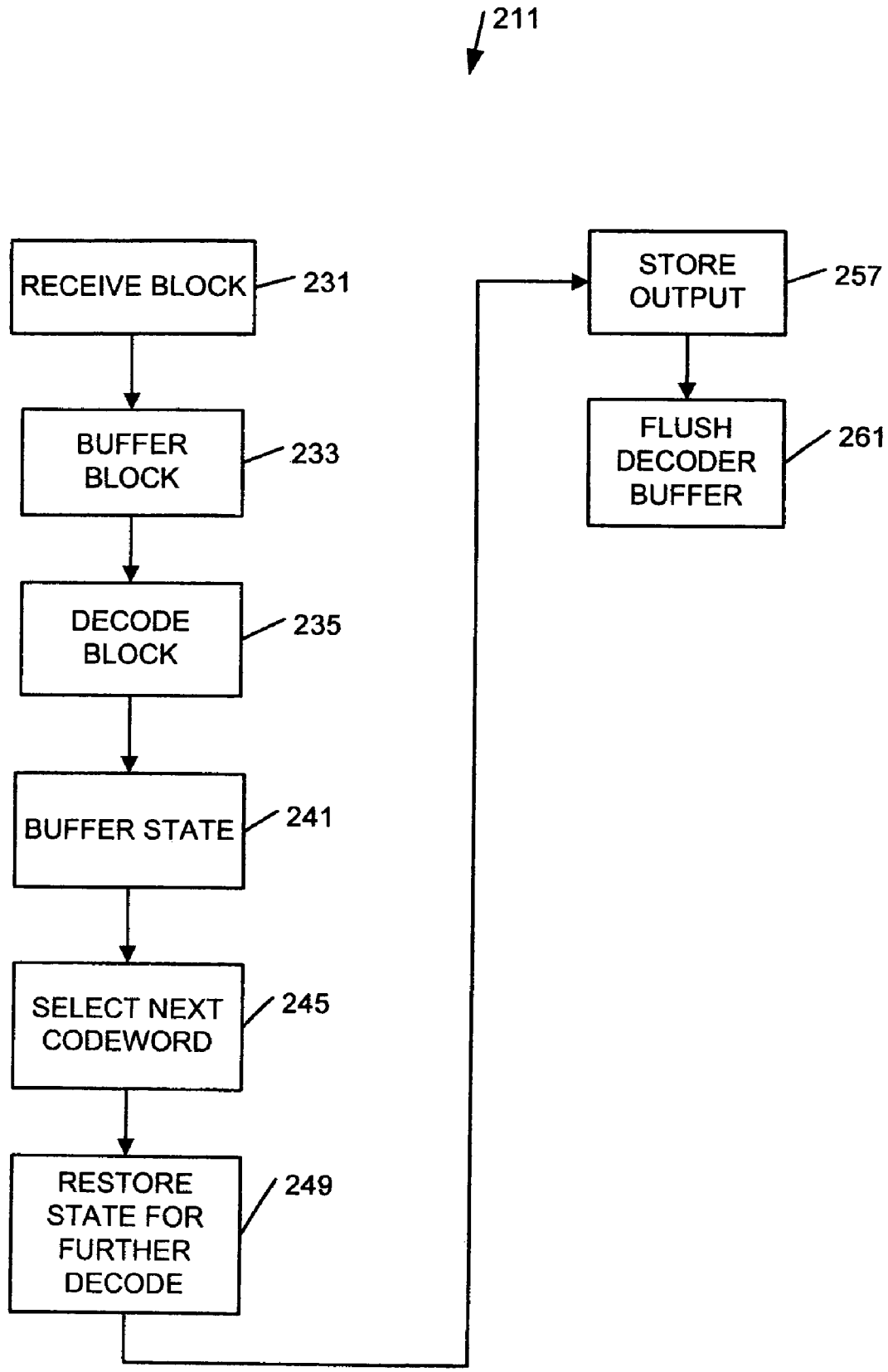
FIG. 2 is a flow diagram illustrating several methods according to various embodiments of the invention.

For example, FIG. 2 is a flow diagram illustrating several methods 211 according to various embodiments of the invention. A method 211 may (optionally) begin at block 231 with receiving at an iterative decoder a plurality of codewords associated with a corresponding plurality of forward error correction-encoded data blocks, perhaps at a specified block rate. As is the case with many embodiments, a codeword may comprise a soft codeword, a hard codeword, and/or any other codeword subject to iterative decoding.

The method 211 may continue with buffering a received data block at box 233, possibly by storing the received block in an input buffer. The method 211 may also include iteratively decoding a first data block selected from the plurality of data blocks during a maximum period approximately equal to an inverse of the block rate at box 235. The method 211 may further include buffering a state of the iterative decoder operating on the codeword associated with a partially decoded forward error correction-encoded data block at box 241.

The method 211 may operate to select for decoding a next codeword associated with an undecoded data block and/or with the partially decoded data block at box 245. The method 211 may further operate to restore a previously-buffered decoder state and/or to perform additional decoding iterations on the data block during a period when the iterative decoder is idle at box 249. Thus, if the input buffer is empty, decoder cycles may be used to decode a partially-decoded data block, perhaps one previously stored in a decoder buffer.

An idle period may comprise a maximum period approximately equal to the inverse of the block rate (as previously defined), less a period between a time of receipt of an immediately prior decoded data block and a time of successfully completing a decode of the immediately prior decoded data block. A decoder state may be selected for restoring and/or further decoding based upon a number of iterations performable during the maximum period, a number of iterations performed on the partially decoded data block, a number of iterations performed on an immediately prior decoded data block, a location in a buffer of the partially decoded data block, and/or an amount of time remaining before receipt of the next expected data block.

The method 211 may (optionally) terminate by storing a decoder output in an output buffer at box 257, and/or flushing a decoder buffer upon a completion of decoding at box 261. It should be noted that the decoder output may comprise a data word, a hard codeword, and/or a soft codeword. A soft codeword may comprise a concatenation of a data word, a code bit, and/or a plurality of bit reliability values.

It should be noted that the methods described herein do not have to be executed in the order described, or in any particular order. Moreover, various activities described with respect to the methods described herein can be executed in serial or parallel fashion.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 3:
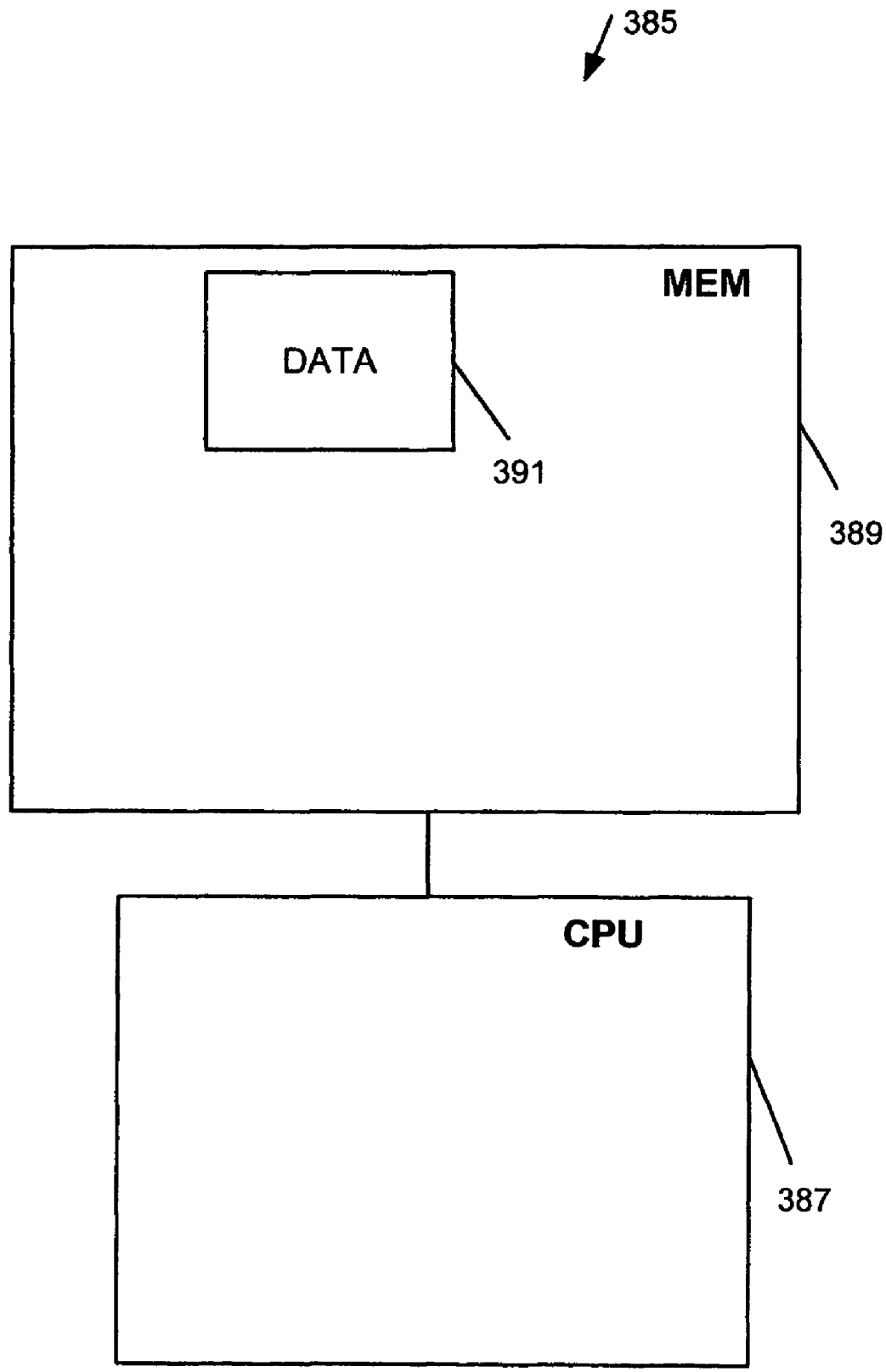
FIG. 3 is a block diagram of an article according to various embodiments of the invention.

For example, FIG. 3 is a block diagram of an article 385 according to various embodiments of the invention. Examples of such embodiments may comprise a computer, a memory system, a magnetic or optical disk, some other storage device, and/or any type of electronic device or system. The article 385 may include a processor 387 coupled to a machine-accessible medium such as a memory 389 (e.g., a memory including an electrical, optical, or electromagnetic conductor) having associated information 391 (e.g., computer program instructions and/or data), which, when accessed, results in a machine (e.g., the processor 387) performing such actions as buffering the state of an iterative decoder operating on a codeword associated with a partially decoded forward error correction-encoded data block.

Other activities may include restoring the decoder state to perform additional decoding iterations on the data block during a period when the iterative decoder is idle. As previously mentioned, the codeword may comprise a soft codeword, including a concatenation of a data word, a code bit, and/or a plurality of bit reliability values. Further activities may include flushing one or more decoder buffers upon a completion of decoding.

Implementing the apparatus, systems, and methods disclosed herein may decrease circuit complexity and/or processing resources used to iteratively decode forward error correction-encoded data streams within allotted time periods.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

All publications, patents, and patent documents are incorporated by reference herein, as though individually incorporated by reference. The invention has been described with reference to various specific and preferred embodiments and techniques. However, it should be understood that many variations and modifications may be made while remaining within the spirit and scope of the invention.

What is claimed is:

1. A cycle-stealing decoding apparatus comprising:
   a decoder to perform a variable number of iterative decoding operations on a codeword associated with a data block selected from a plurality of data blocks;
   at least one decoder buffer to store an intermediate decoder state corresponding to an incompletely decoded data block after expiration of a block-decode period; and
   a control module to configure the decoder for decoding a next codeword associated with an undecoded data block selected from the plurality and the intermediate decoder state,
   wherein the intermediate decoder state comprises the incompletely decoded data block and a number of iterations performed on the incompletely decoded data block, and
   wherein the control module is further configured to restore a previously-buffered decoder state and instruct the decoder to perform additional decoding iterations on the incompletely decoded data block during a period when the decoder is idle to allow decoder cycles to be used to decode the incompletely decoded data block stored in the decoder buffer.

2. The cycle-stealing decoding apparatus of claim 1, wherein the codeword comprises a soft codeword.

3. The cycle-stealing decoding apparatus of claim 2, wherein a soft bit of the soft codeword comprises at least one of a real value and an integer value to indicate a probability that a state of a bit associated with the data block selected from the plurality of data blocks is as represented.

4. The cycle-stealing decoding apparatus of claim 3, further including:
   at least one output buffer coupled to the decoder to store an output of the decoder.

5. The cycle-stealing decoding apparatus of claim 4, further including:
   at least one input buffer coupled to the decoder to store a data block included in the plurality of data blocks.

6. The cycle-stealing decoding apparatus of claim 1, further including:
   a selector configured by the control module coupled to the at least one decoder buffer and to an input buffer to route either the next codeword or the incompletely decoded data block to the decoder.

7. The cycle-stealing decoding apparatus of claim 6, wherein the decoder comprises a low-density parity check decoder.

8. The cycle-stealing decoding apparatus of claim 6, wherein the decoder comprises a turbo code decoder.

9. The cycle-stealing decoding apparatus of claim 6, wherein the variable number of iterative decoding operations comprises a number required to satisfy a criterion.

10. The cycle-stealing decoding apparatus of claim 9, wherein the criterion comprises reaching a state of substantial equivalency of an actual parity value and a calculated parity value.

11. A wireless communication device comprising:
    a receiver coupled to a first antenna to receive an error-correctable bit pattern;

a decoder coupled to the receiver to perform a variable number of iterative decoding operations on a codeword associated with a data block selected from a plurality of data blocks;

at least one decoder buffer to store an intermediate decoder state corresponding to an incompletely decoded data block after expiration of a block-decode period; and a control module to configure the decoder for decoding a next codeword associated with an undecoded data block selected from the plurality and the intermediate decoder state, wherein the intermediate decoder state comprises the incompletely decoded data block and a number of iterations performed on the incompletely decoded data block, and wherein the control module is further configured to restore a previously-buffered decoder state and instruct the decoder to perform additional decoding iterations on the incompletely decoded data block during a period when the decoder is idle to allow decoder cycles to be used to decode the incompletely decoded data block stored in the decoder buffer.

12. The system of claim 11, wherein the codeword comprises a soft codeword.

13. The system of claim 11, further including:

an encoder to encode the error-correctable bit pattern; and a second antenna coupled to the encoder to transmit the error-correctable bit pattern.

14. The system of claim 13, further including:

a transmitter coupled to the encoder to transmit the error-correctable bit pattern.

* * * * *

UNITED STATES PATENT AND TRADEMARK OFFICE
CERTIFICATE OF CORRECTION

| | | |
|---|---|---|
| PATENT NO. | : 7,631,248 B2 | Page 1 of 1 |
| APPLICATION NO. | : 11/346883 | |
| DATED | : December 8, 2009 | |
| INVENTOR(S) | : Zakharchenko et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 619 days.

Signed and Sealed this

Twenty-first Day of December, 2010

David J. Kappos
*Director of the United States Patent and Trademark Office*